United States Patent
Hsuan et al.

(10) Patent No.: US 8,607,171 B2
(45) Date of Patent: Dec. 10, 2013

(54) SYSTEM AND METHOD FOR OPTICAL PROXIMITY CORRECTION OF A MODIFIED INTEGRATED CIRCUIT LAYOUT

(75) Inventors: Chungte Hsuan, Hsinchu (TW); Chao-Lung Lo, Jhubei (TW); Tien-Chu Yang, Hsinchu (TW); Tahone Yang, Hsinchu (TW); Kuang-Chao Chen, Hsinchu County (TW); Chien Hung Chen, Fongshan (TW)

(73) Assignee: Macronix International Co., Ltd. (TW)

( * ) Notice: Subject to any disclaimer, the term of this patent is extended or adjusted under 35 U.S.C. 154(b) by 130 days.

(21) Appl. No.: 13/091,316

(22) Filed: Apr. 21, 2011

(65) Prior Publication Data

US 2012/0272195 A1    Oct. 25, 2012

(51) Int. Cl.
*G06F 17/50* (2006.01)
(52) U.S. Cl.
USPC .............................................. 716/53; 716/54
(58) Field of Classification Search
USPC .............................. 716/51, 52, 53, 54, 55, 132
See application file for complete search history.

(56) References Cited

U.S. PATENT DOCUMENTS

| 7,275,227 B1 | 9/2007 | Ying |
| 2008/0216047 A1* | 9/2008 | Wu et al. ........................ 716/19 |

OTHER PUBLICATIONS

Gennari, Frank, "Optical Proximity Correction" Jan. 28, 2004.

* cited by examiner

*Primary Examiner* — Vuthe Siek
(74) *Attorney, Agent, or Firm* — Baker & McKenzie LLP

(57) ABSTRACT

A system and method for modifying an integrated circuit (IC) layout includes performing a correction process, such as an optical proximity correction (OPC) process, only on regions within designated blocks that are defined around respective modified structures. An IC layout can be compared to a modified version of the IC layout to detect modified structures. One or more large blocks can then be defined around respective modified structures. A correction process can then be performed on only the one or more large blocks. Small blocks within respective large blocks can then be extracted from the modified IC layout and merged with the original IC layout to generate a final modified and corrected IC layout.

31 Claims, 16 Drawing Sheets

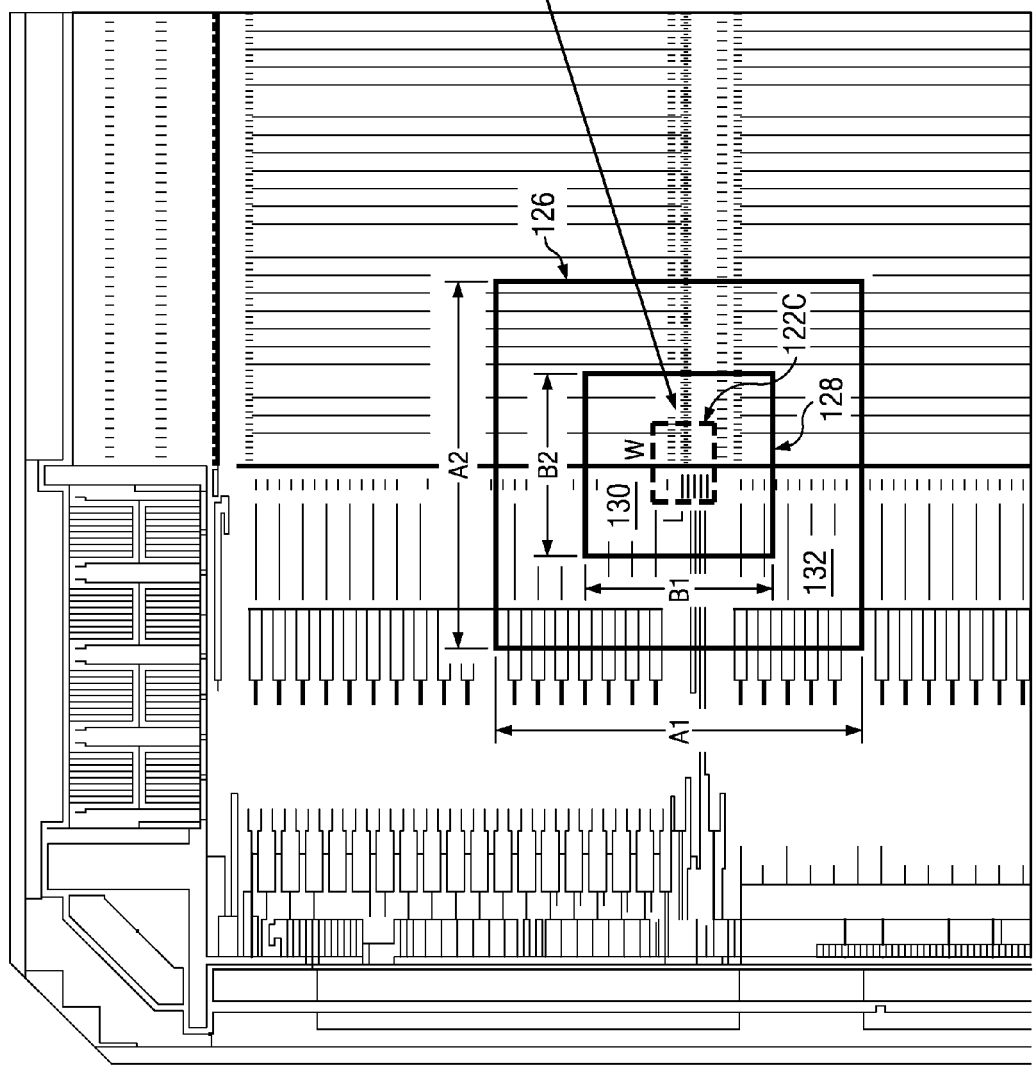

SYSTEM AND METHOD FOR OPTICAL PROXIMITY CORRECTION OF A MODIFIED INTEGRATED CIRCUIT LAYOUT

BACKGROUND

1. Technical Field

The present application relates generally to systems and methods for manufacturing integrated circuits, particularly to optical proximity correction of integrated circuit layouts.

2. Related Art

The manufacturing of integrated circuit (IC) devices usually includes one or more photolithography processes. Photolithography is a common process that involves forming a pattern on a semiconductor substrate. The pattern can then be used for selective removal of material from the wafer. In this way, a desired pattern can be formed on the wafer.

However, for a variety of reasons, the desired pattern is not always precisely formed on the substrate. For example, FIG. 1A shows an example of an IC layout 10 that is desired to be formed on a wafer using photolithography, and FIG. 1B shows the resulting formation 12 on the wafer. The resulting formation 12 differs somewhat from the desired IC layout 10 due to errors introduced during the photolithographic processes. Such variations can cause significant problems with the resulting device, such as failures due to shorts and undesirable variations in device operation characteristics.

In order to avoid such problems, correction processes are typically performed on the IC layout before the IC layout is transferred to a wafer. One common correction process is known as optical proximity correction (OPC). OPC processes are known processes for modifying an IC layout, such as IC layout 10, to produce a corrected IC layout, such as the corrected IC layout 14 shown in FIG. 2A. OPC processes involve making modifications to the IC layout based on predicted variations in the photolithography process so that the resulting structure will more closely resemble the desired layout. For example, FIG. 2B shows the result of using the corrected IC layout 14 in a photolithographic process to produce a structure 16. Compared to structure 12, the structure 16 more closely resembles the desired layout 10 because of the OPC processes used to make the corrected IC layout 14.

A problem with correction processes such as OPC is that the correction processes are very complex and time consuming. For example, OPC processes are generally iterative processes that involve multiple iterations of modifying shapes and predicting the result of the modified shapes with the goal of approaching the desired shape through the numerous modification iterations. Also, a typical IC layout is far more complex than the very simple IC layout 10 shown in FIG. 1A. For example, an IC design may include 50 million transistors, which may be formed using IC layouts containing more than a billion shapes. For this reason, OPC processes are often performed using powerful computer systems having multiple processors and large amounts of memory. However, performing a multiple-iteration OPC process on such a layout will still generally require several hundred CPU hours.

Sometimes it is necessary to make changes to the IC design after the OPC process has already been performed on the IC layouts. FIG. 3 shows a flowchart of a conventional process for generating an IC layout when changes are made to the IC design. At blocks 20-26, an IC layout is generated based on an initial IC layout. Between blocks 26 and 30, changes are made to the initial IC layout. Then, at blocks 30-36, a revised IC layout is generated based on the revised IC layout.

Initially, at block 20, a database is provided containing data representative of a first IC layout. Various techniques are known in the art for generating data representative of a mask layout, and so such techniques are not described herein. Next, at block 22, assist features are added to the first IC layout. Assist features are features that are added to the layout, but are not intended to be formed on the wafer. Assist features are used to avoid defects by helping to enhance optical resolution during the photolithography process. Next, at block 24, the entire first IC layout undergoes the OPC process. Finally, at block 26, a corrected version of the first IC layout is output for masking and further photolithographic processes.

When a change is made to the first IC layout, a second database is created at block 30 containing data representative of a second IC layout, which is the modified version of the first IC layout. At block 32, assist features are added to the second IC layout, at block 34 the OPC process is performed on the entire second IC layout, and at block 36 a corrected version of the second IC layout is output for masking and further photolithographic processes.

Thus, when a change is made to an IC layout, the process for producing the mask data is repeated for the new IC layout, including performing the OPC process again for the entire revised IC layout. Since the OPC process is very time consuming, this means that any change to the IC layout requires a very time-consuming process for generating a corresponding revised mask layout.

Thus, it is desirable to find new approaches for revising an IC mask whenever changes are made to an IC layout.

SUMMARY

Disclosed herein is a system and method for modifying a semiconductor IC layout.

According to one aspect of the present disclosure, a method is disclosed for modifying a first integrated circuit (IC) layout based on a second IC layout, where the second IC layout includes a modification of the first layout. The method can be performed by one or more processors, and can include selecting a large block of the second IC layout, and then performing a correction operation on the large block, thereby generating a corrected large block. The method can also include selecting a first small block, where the first small block is a portion of the first layout, and selecting a second small block, where the second small block is a portion of the corrected large block. The first small block can be removed from the first IC layout, and all but the second small block can be removed from the second IC layout. A final layout can then be generated by merging the remaining portions of the first and second IC layouts.

The large block of the second IC layout can include the modification of the first IC layout. The correction operation can include an optical proximity correction process. The location of the first small block within the first IC layout can be the same as the location of the second small block within the second IC layout. The method can also include adding assist features to the second layout prior to performing the correction operation. The second small block can be a central portion of the corrected large block. The first and second small blocks can be the same size. The merging of the first and second IC layouts can include generating a merged IC layout, and the method can further include outputting the merged IC layout as mask data.

According to one aspect of the present disclosure, a system is disclosed for modifying a first integrated circuit (IC) layout based on a second IC layout, where the second IC layout includes a modification of the first layout. The system can comprise one or more processors configured for selecting a large block of the second IC layout, performing a correction operation on the large block, thereby generating a corrected large block, selecting a first small block, where the first small block is a portion of the first layout, selecting a second small block, where the second small block is a portion of the corrected large block, removing the first small block from the first IC layout, removing all but the second small block from the second IC layout, and merging the first and second IC layouts.

The large block of the second IC layout can include the modification of the first IC layout. The correction operation can include an optical proximity correction process. The location of the first small block within the first IC layout can be the same as the location of the second small block within the second IC layout. The one or more processors can be further configured for adding assist features to the second layout prior to performing the correction operation. The second small block can be a central portion of the corrected large block. The first and second small blocks can be the same size. The merging of the first and second IC layouts can include generating a merged IC layout, and the one or more processors can be further configured for outputting the merged IC layout as mask data.

According to a further aspect of the present disclosure, a method is disclosed for modifying a first integrated circuit (IC) layout based on a second IC layout, where the method can be performed by one or more processors, and can comprise performing a correction operation on a first large block of the second IC layout, and replacing a first small block of the first IC layout with a second small block of the second IC layout, where the second small block includes a portion of the first large block of the second IC layout.

The performing of the correction operation can further comprise performing a correction operation on a second large block of the second IC layout, and in such cases, the method can also further comprising replacing a third small block of the first IC layout with a fourth small block of the second IC layout, where the fourth small block includes a portion of the second large block of the second IC layout.

The first large block of the second IC layout can include a modification of the first IC layout. The correction operation can include an optical proximity correction process. The location of the first small block within the first IC layout can be the same as the location of the second small block within the second IC layout. The method can further comprise adding assist features to the second layout prior to performing the correction operation. The second small block can be a central portion of the first large block. The first and second small blocks can be the same size. The replacing of the first small block of the first IC layout with the second small block of the second IC layout can include generating a merged IC layout, and the method can further comprise outputting the merged IC layout as mask data.

BRIEF DESCRIPTION OF THE DRAWINGS

Features, aspects, and embodiments of the inventions are described in conjunction with the attached drawings, in which:

FIGS. 7A and 7B show examples of large and small blocks defined in an IC layout;

DETAILED DESCRIPTION

The present disclosure provides for improved IC manufacturing processes, particularly with respect to the preparation of a revised IC mask that can be used for photolithography. As disclosed herein, the amount of time required for generating a revised IC mask can be significantly reduced by reducing the area of the IC layout that undergoes a correction process such as OPC.

Figure 13:
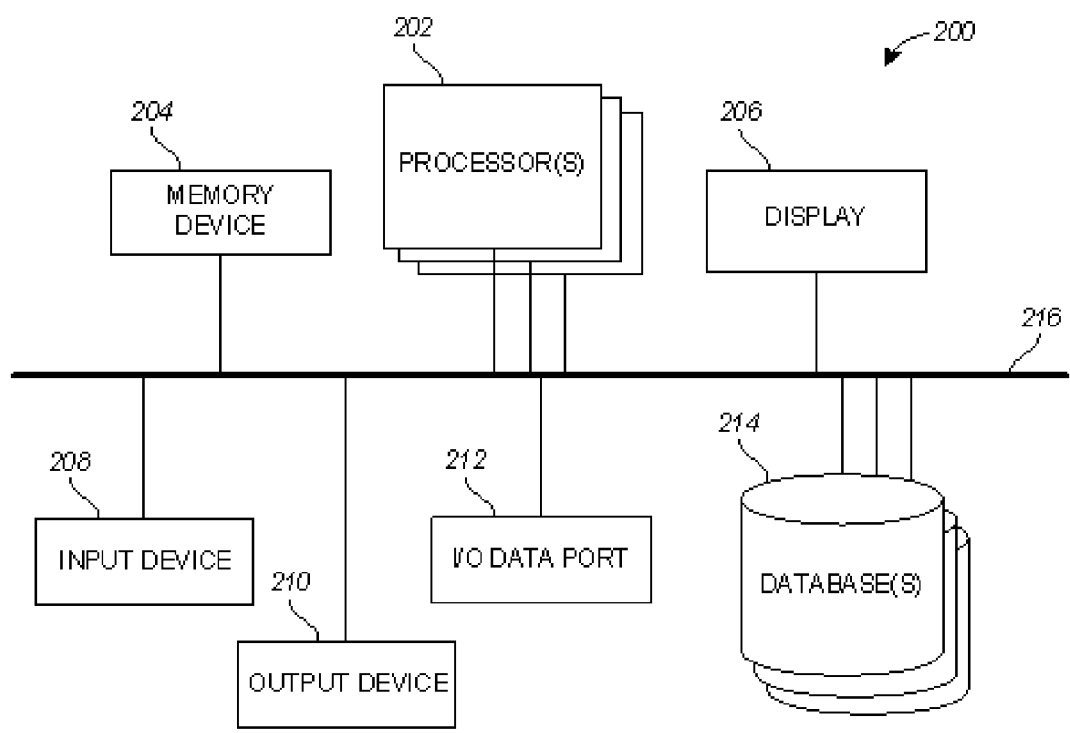
FIG. 13 shows a block diagram of an embodiment of a processor-based system suitable for performing processes disclosed herein.

Processes described herein can be performed by a processor-based system such as system 200 shown in FIG. 13. The system 200 is shown merely by way of example, and is in no way to be considered limiting. There exists a wide variety of processor or computer based systems that can be configured to perform processes described herein. For example, a desktop computer can be provided with software instructions for performing some or all of the processes described herein. However, for the sake of clarity, system 200 is shown as an example of a system for performing modifications to IC layouts as described herein.

System 200 can include one or more processors 202, which can be configured to operate independently or in concert to perform operations according to software instructions for performing any of the processes described herein. The software instructions can be provided, for example, locally and/or remotely, for example on a memory device 204. Memory device 204 is representative of any type of data storage device, including but not limited to optical drives and/or solid state electronic memory devices. Operation of the processor(s) 202 can be influenced by user input, for example via input device 208. Input device 208 is representative of one or more known computer input devices, which can include, for example, a keyboard, mouse, touch screen, and/or microphone. A user can receive information from the processor(s) 202 via a display 206 and/or other output devices, collectively represented as output device 210. Display 206 can include one or more display devices, such as LCD and/or LED computer monitors. Output device 210 is representative of various types of output devices, which can include, for example, a speaker, a printer, and/or a plotter.

In addition to software instructions, the processor(s) 202 can input from, and output to, one or more databases 214 or other devices via I/O data port 212. Database(s) 214 can include local and/or remote databases, for example that store data representative of one or more IC layouts. In addition, or alternatively, other devices, such as those used to generate IC layouts, can communicate IC layout data to the system 200 via I/O data port 212. Similarly, the system 200 can communicate revised IC layout data to other systems via I/O data port 212.

Communications between the shown components of system 200, as well as other components not shown, can occur via one or more system buses 216, which can include wired and/or wireless communications, and which can include communications over a local bus and/or over one or more networks, which can include the Internet.

Figure 1A:
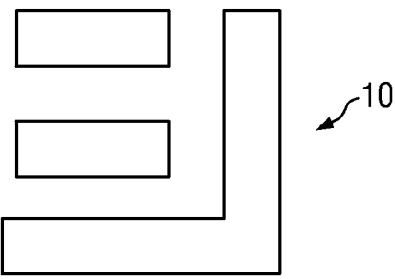
FIG. 1A shows an example of an IC layout.
Figure 1B:
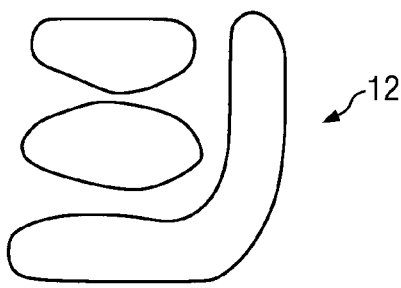
FIG. 1B shows the resulting formation.
Figure 2A:
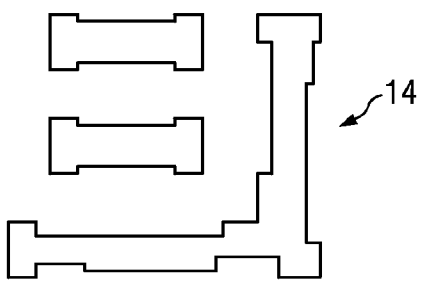
FIG. 2A shows an example of a corrected IC layout.
Figure 2B:
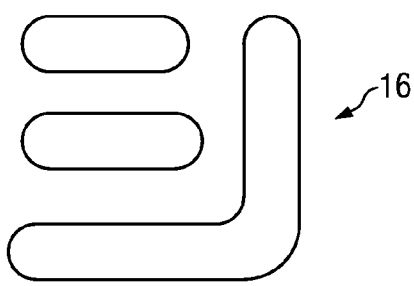
FIG. 2B shows the resulting formation.
Figure 3:
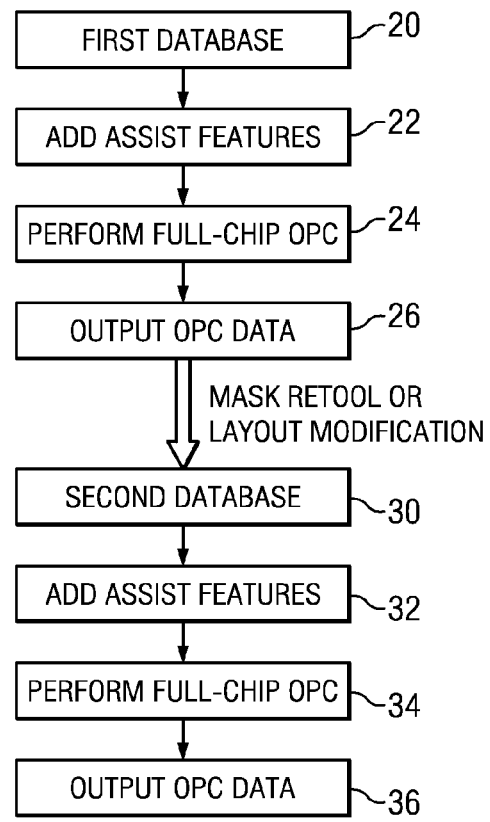
FIG. 3 shows a flowchart of a conventional process for generating an IC layout when changes are made to the IC design.
Figure 4:
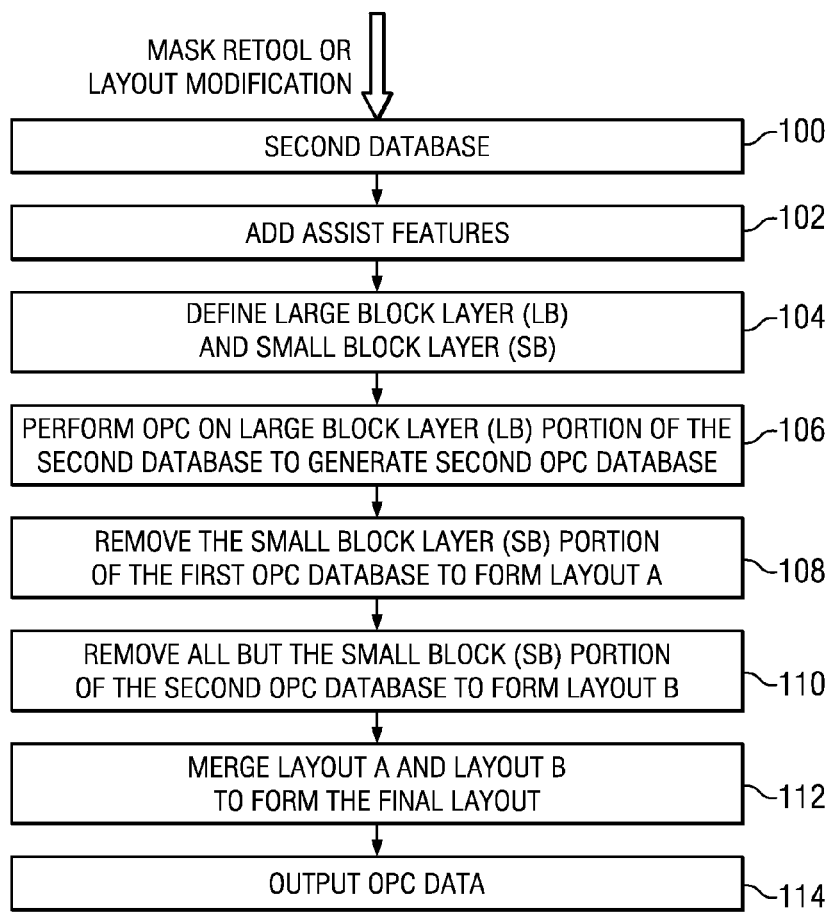
FIG. 4 shows a flowchart of a process for generating a revised IC layout according to the present disclosure.

FIG. 4 shows a flowchart of a process for generating a revised IC layout. The process begins at block 100 with receipt of a revised IC layout. For example, first corrected IC layout can be generated from a first IC layout according to blocks 20-26 in FIG. 3. One or more modifications can then be made to the first IC layout, thereby resulting in a second IC layout. The second IC layout is then received at block 100 for generation of a corresponding second corrected IC layout.

When a change is made to the first IC layout, a second database is created at block 100 containing data representative of a second IC layout, which is the modified version of the first IC layout, and which includes one or more modifications to the first IC layout. At block 102, assist features can be added to the second IC layout. At block 104, one or more large blocks and small blocks are defined within the second IC layout. At block 106, a correction process, such as OPC, is performed on the large block or blocks defined at block 104, thereby generating one or more respective corrected large blocks. At block 108, one or more small blocks are removed from the first corrected IC layout. At block 110, all but the one or more small blocks defined at block 104 is removed from respective corrected large blocks so that only the one or more small blocks remain. At block 112, the one or more small blocks remaining from the second IC layout are merged with the first corrected IC layout in respective locations where one or more corresponding small blocks of the first corrected IC layout were removed. As a result, a merged IC layout is produced as a second corrected IC layout. The second corrected IC layout can then be output as a revised and corrected IC layout at block 114.

The process outlined by the flowchart shown in FIG. 4 is described below in greater detail in connection with FIGS. 5-11.

Figure 5A:
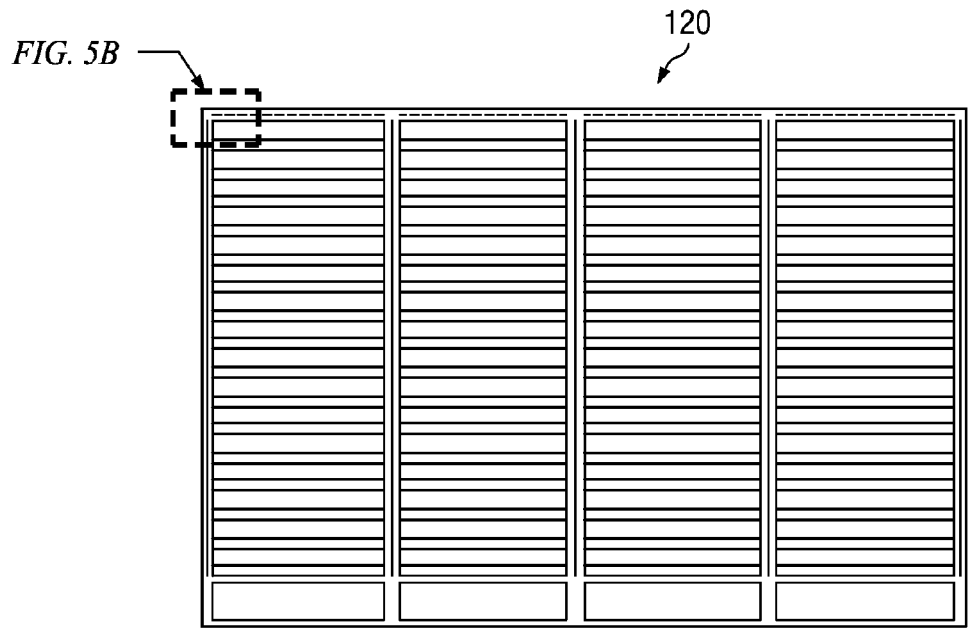
FIG. 5A shows an IC layout.
Figure 5B:
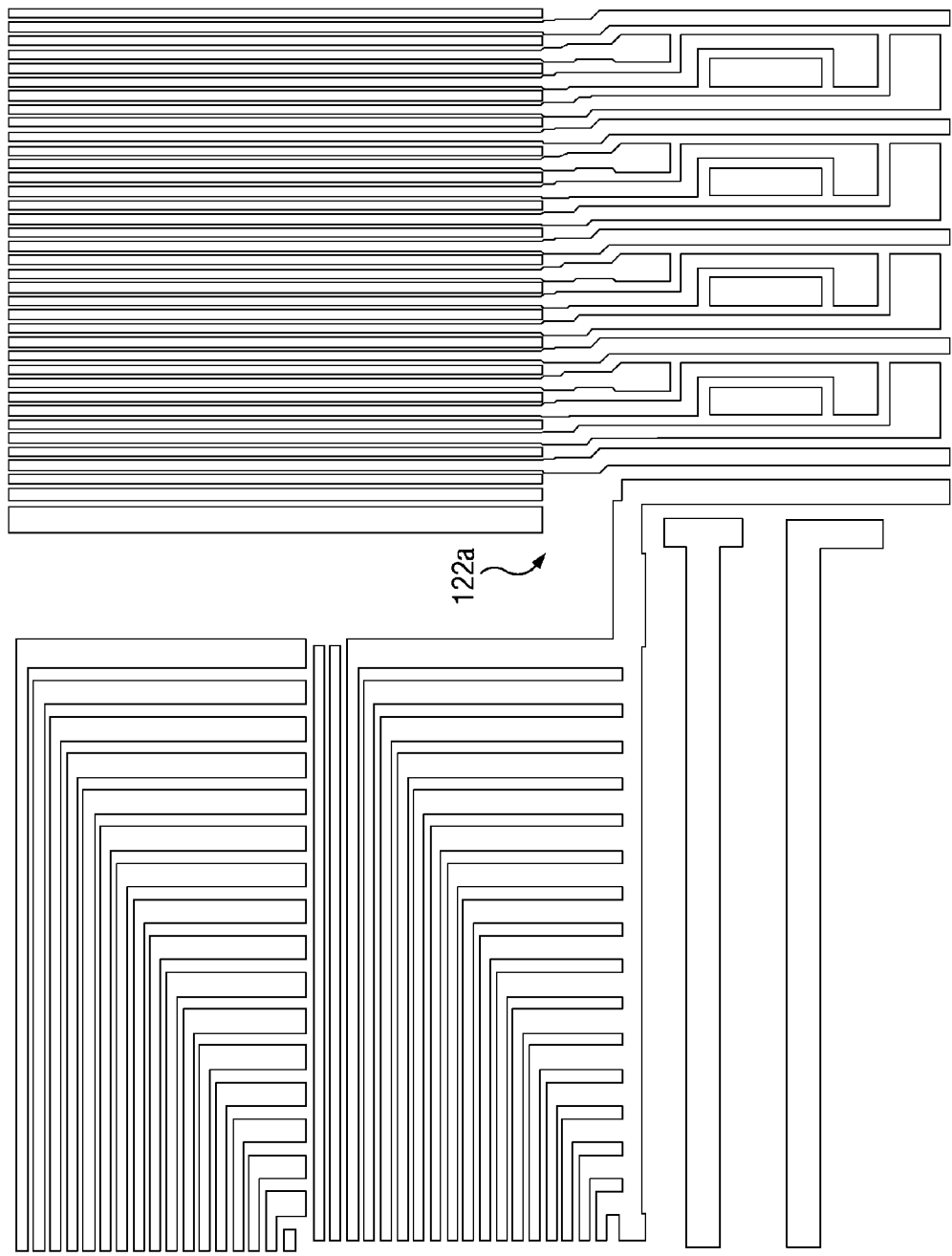
FIG. 5B shows an enlarged view of the designated portion of the IC layout.
Figure 6:
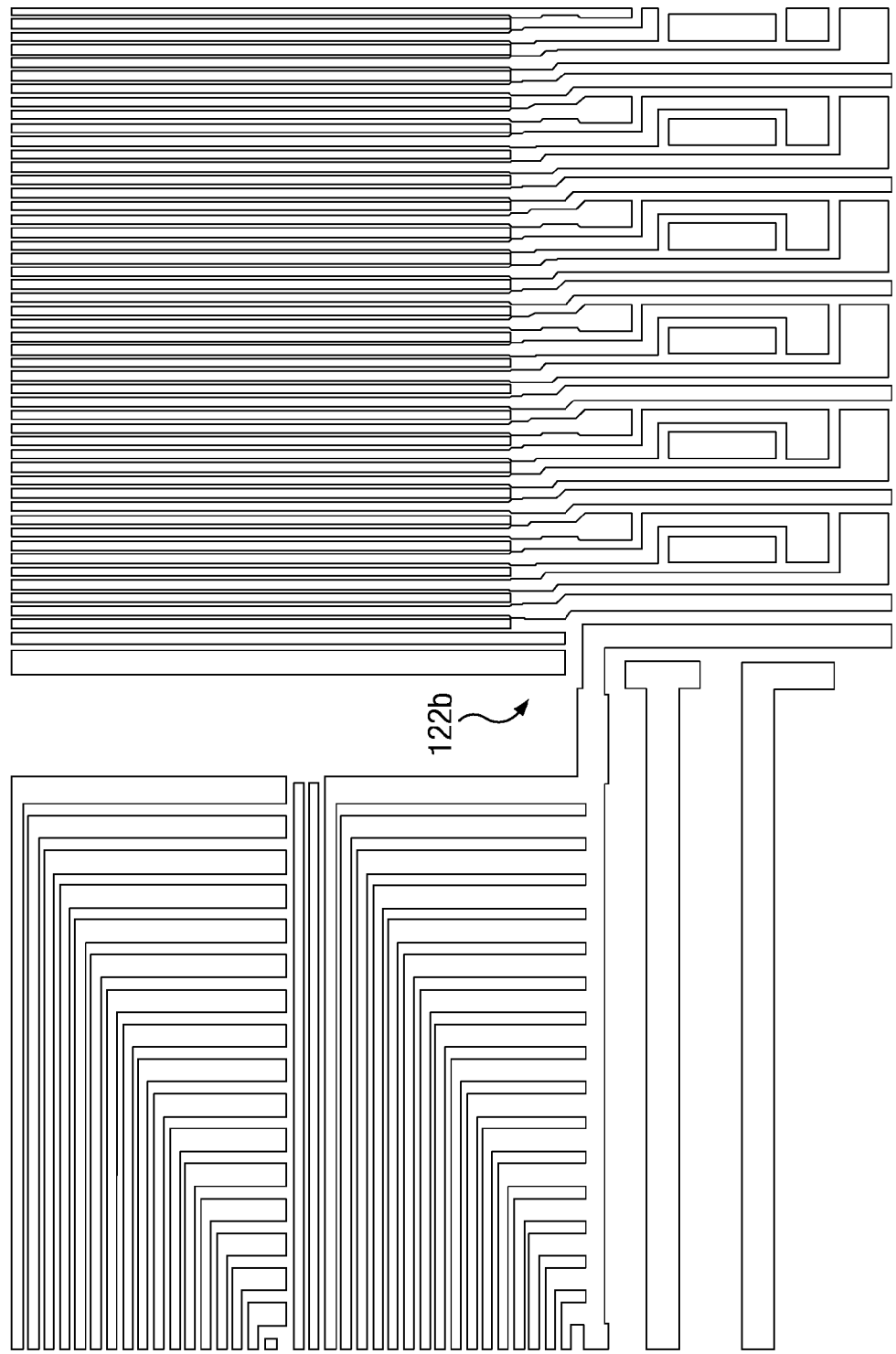
FIG. 6 shows a modified version of the IC layout shown in FIG. 5B.

FIG. 5A shows an IC layout 120, and FIG. 5B shows an enlarged view of the designated portion of the IC layout 120. The IC layout 120 includes a formation 122a that has been designated for modification. FIG. 6 shows the implementation of the modification, where region 122a has been replaced with formation 122b. The IC layout 120 with the formation 122a constitutes a first corrected IC layout, meaning that the IC layout 120 with the formation 122a has already undergone OPC processing, for example according to a process such as shown in blocks 20-26 in FIG. 3. The IC layout 120 with revisions, including the revised formation 122b, constitutes a second IC layout that has not yet undergone OPC processing. Also, while only the revised formation 122b is shown, the second IC layout can include any number of modifications to the first corrected IC layout. For purposes of this description, first corrected IC layout is also referred to as a first database composed of data representative of the first corrected IC layout, and the second IC layout is also referred to as a second database composed of data representative of the second IC layout. The second IC layout (second database) is provided at block 100 in FIG. 4 for correction processing.

Figure 7B:
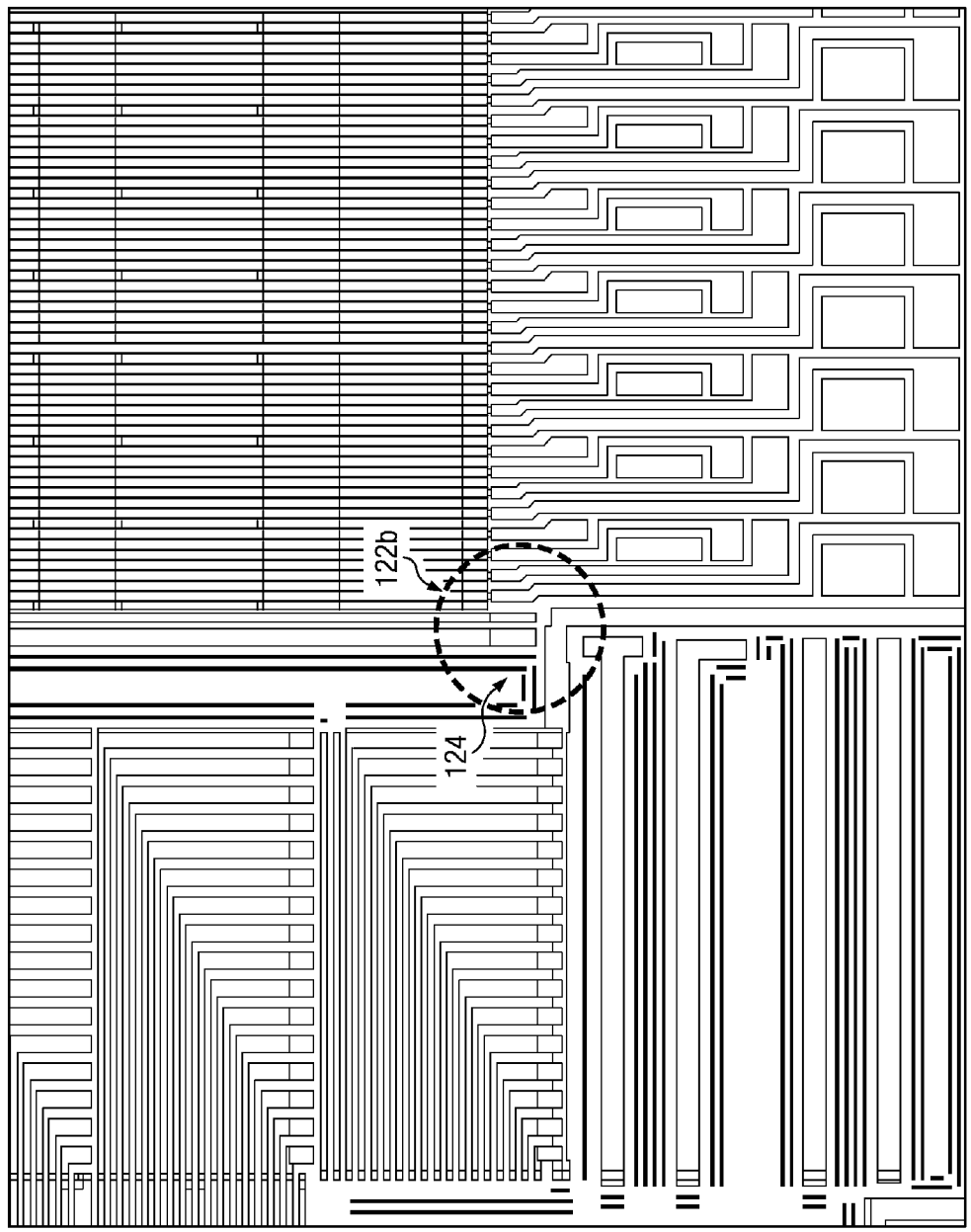

As indicated by block 102, assist features can be added as appropriate to the second IC layout, particularly in view of the modifications made to the first IC layout. It is also contemplated that assist features may be added, removed, and/or relocated depending on the modifications that were made to the first IC layout. FIG. 7B shows the revised formation 122b with assist features 124 that have been added.

Next, as indicated by block 104, and with reference to FIGS. 7A and 7B, a large block 126 and a small block 128 are defined in the second IC layout. FIG. 7A shows an enlarged portion of the second IC layout that includes a modified region 122c of the second IC layout. FIG. 7B shows an enlarged view of the modified region 122c, which is the designated portion of the view shown in FIG. 7A.

The process at block 104 can include identifying all of the modifications to the first corrected IC layout, and then defining a large block around each modified region. The modifications can be detected by performing comparison operations for detecting differences between the first and second databases. For example, the modifications can be detected by comparing the first and second databases using a Boolean operation, for example an XOR operation.

Once a modified region has been detected, a large block and a small block are both defined around the modified region. The large and small blocks are preferably defined such that the modified region is substantially central to both blocks. For example, in FIG. 7A, a modified region 122c is a rectangular region that closely outlines revised formations, including the revised formation 122b, of the IC layout. In FIG. 7A, a large block 126 is therefore defined around the modified region 122c, with the modified region 122c being substantially central to the large block 126. A small block 128 is also defined around the revised formation 122b, with the modified region 122c also being substantially central to the small block 128. If multiple modified regions are detected, then a respective large block and a respective small block are defined around each of the modified regions in the same manner.

The modified region 122c can be defined to be a rectangular block forms a close boundary around a cluster of modifications, where the rectangular block has a length dimension L and a width dimension W. Note that in some cases, the modified region can be a square block where W=L. The large block 126 can be a rectangular block having a length dimension A1 and a width dimension A2. In some embodiments, the large block 126 can be a square block where A1=A2. The small block 128 can be a rectangular block that is smaller than the large block 126. The small block 128 has a length dimension B1 and a width dimension B2. In some embodiments, the small block 128 can be a square block where B1=B2. The dimensions A1 and A2 of the large block 126 and the dimensions B1 and B2 of the small block 128 can depend on the size of the revised formation 122b.

The small block 128 preferably includes the modified region 122c and a buffer region 130. The buffer region 130 is composed of unmodified structures, i.e., structures that are the same as those of the first IC corrected layout. Referring to FIG. 7A, for example, the boundary of the modified region 122c is indicated by the broken line in FIG. 7A, which is shown in an enlarged view in FIG. 7B. The boundary of the small block 128 completely surrounds the modified region 122c. The buffer region 130 is provided between the boundary of the small block 128 and the modified region 122c.

The large block 126 preferably includes the small block 128 and a buffer region 132. The buffer region 132 is composed of unmodified structures, i.e., structures that are the same as those of the first IC corrected layout. Referring to FIG. 7A, for example, the boundary of the large block 126 completely surrounds the small block 128 containing the modified region 122c. The buffer region 132 is provided between the boundary of the large block 126 and the small block 128.

According to some embodiments, the dimensions A1 and A2 can be set such that the boundaries of the large block 126 are approximately 50 um from respective boundaries of the modified region 122c. This can be accomplished by setting the dimension A1 such that A1=2*(L/2+50 um), and by setting the dimension A2 such that A2=2*(W/2+50 um).

Also, according to some embodiments, the length are dimension A1 of the large block can be set to be at least twice the length dimension B1 of the small block, and the width dimension A2 of the large block can be set to be at least twice the width dimension B2 of the small block. That is, A1 and B1 can be set such that A1≥2*B1, and A2 and B2 can be set such that A2≥2*B2. For example, in one embodiment, A1=A2=100 μm, and A1=A2=50 μm.

Figures 8A, 8B:
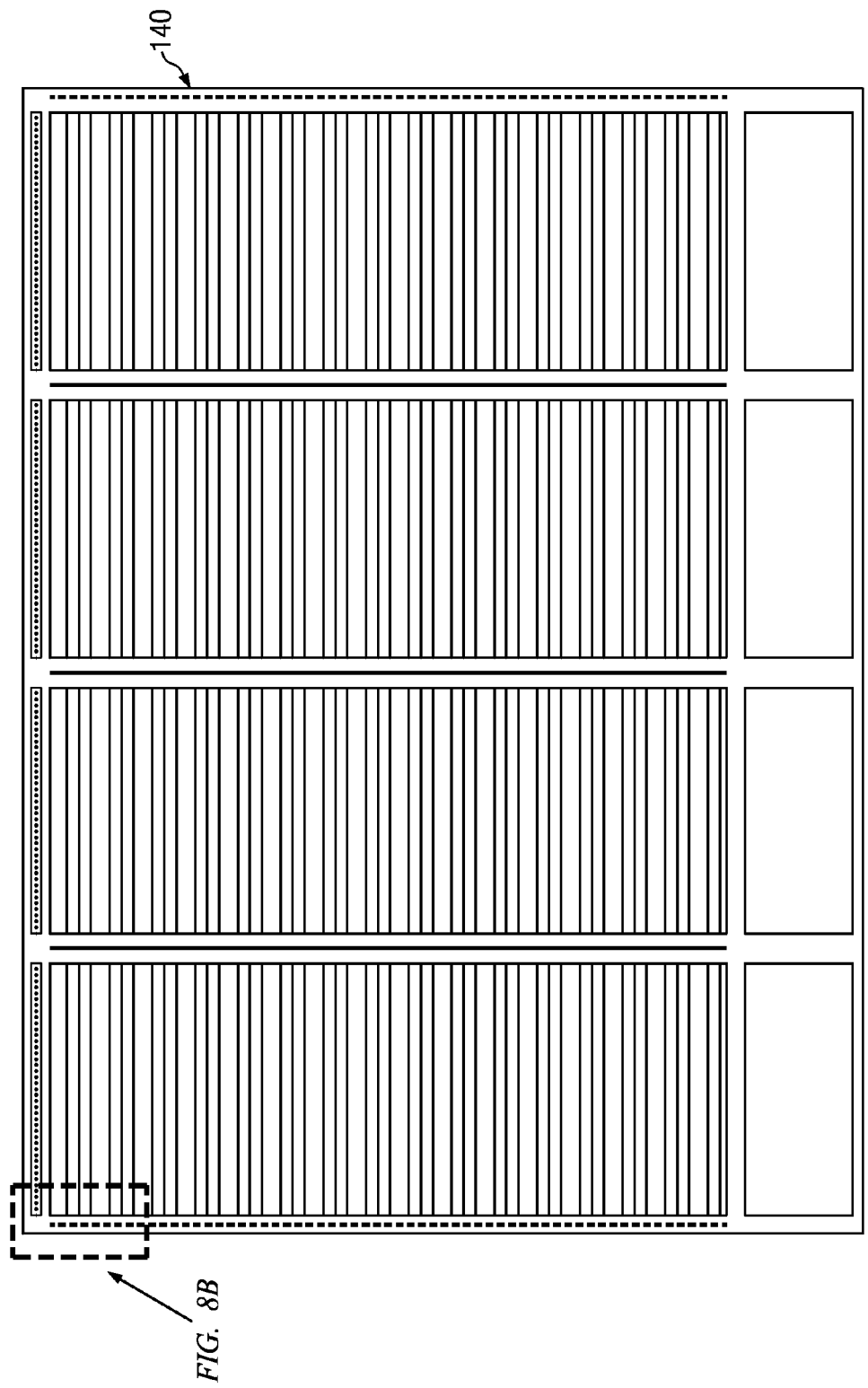
FIGS. 8A and 8B show an example of large block locations of an IC layout that undergo correction processing.
Figure 8B:
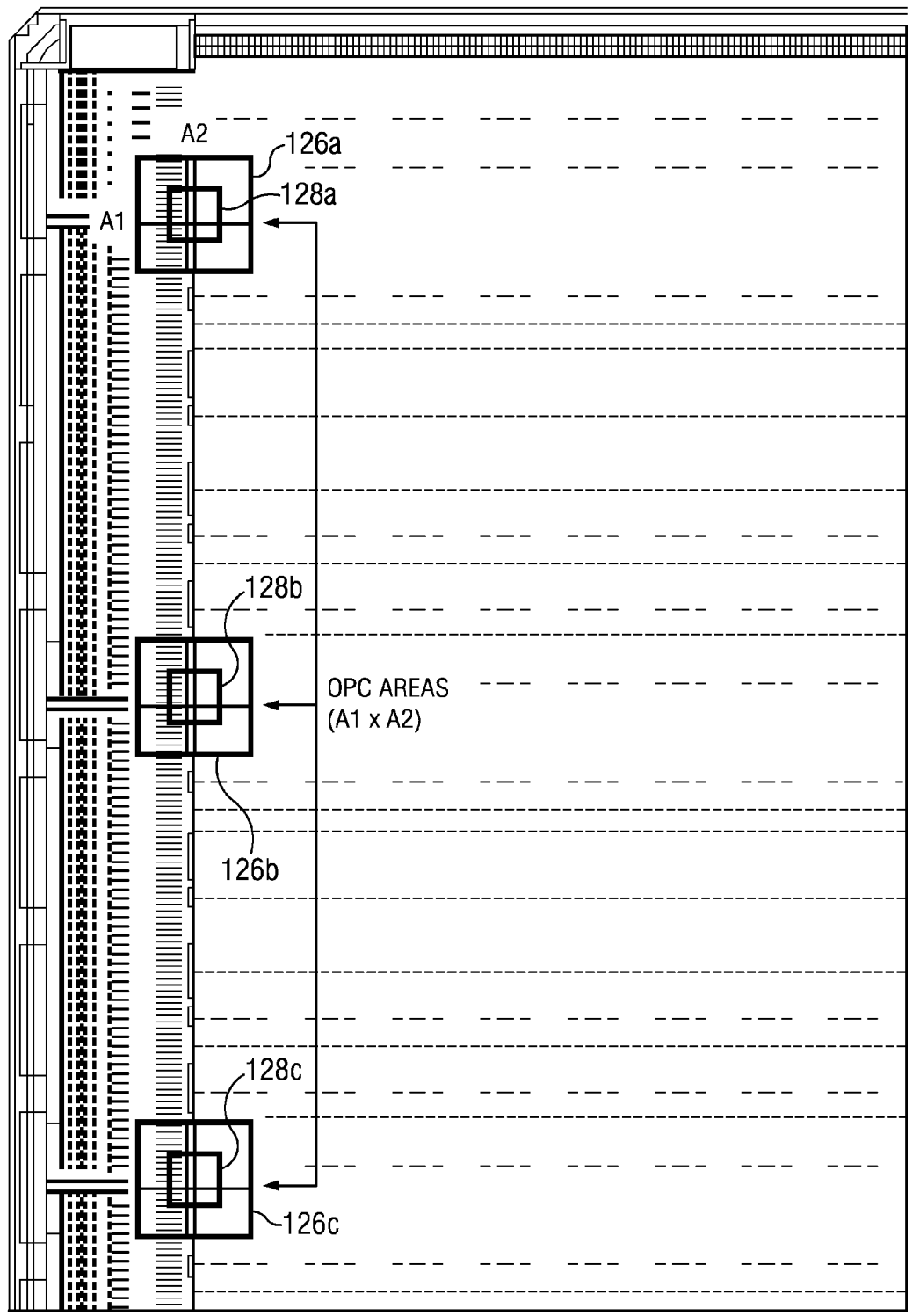

Turning next to FIGS. 8A and 8B, FIG. 8A shows an embodiment of a second IC layout 140, while FIG. 8B shows an enlarged view of a portion of the second IC layout 140 as indicated in FIG. 8A. In this example, the second IC layout 140 includes three revised structures. As described above in connection with block 104, a large block has been defined for each of the three revised structures. Thus, as shown in FIG. 8B, the second IC layout includes large blocks 126a, 126b, and 126c. Also, small blocks 128a, 128b, and 128c are also defined within large blocks 126a, 126b, and 126c, respectively.

As indicated at block 106 in FIG. 4, once all of the modified regions have been located and large blocks have been defined, a correction process such as OPC is performed only on the regions of the second IC layout that are within one of the large blocks 126, thereby generating a second partially-corrected IC layout. Thus, in the example shown in FIGS. 8A and 8B, the correction process is only performed on the portions of the second IC layout 140 that are within the large blocks 126a, 126b, and 126c. As a result, the time required for performing the correction process is significantly less than it would have been if the correction process were performed on the entire second IC layout 140.

Figures 9A, 9B:
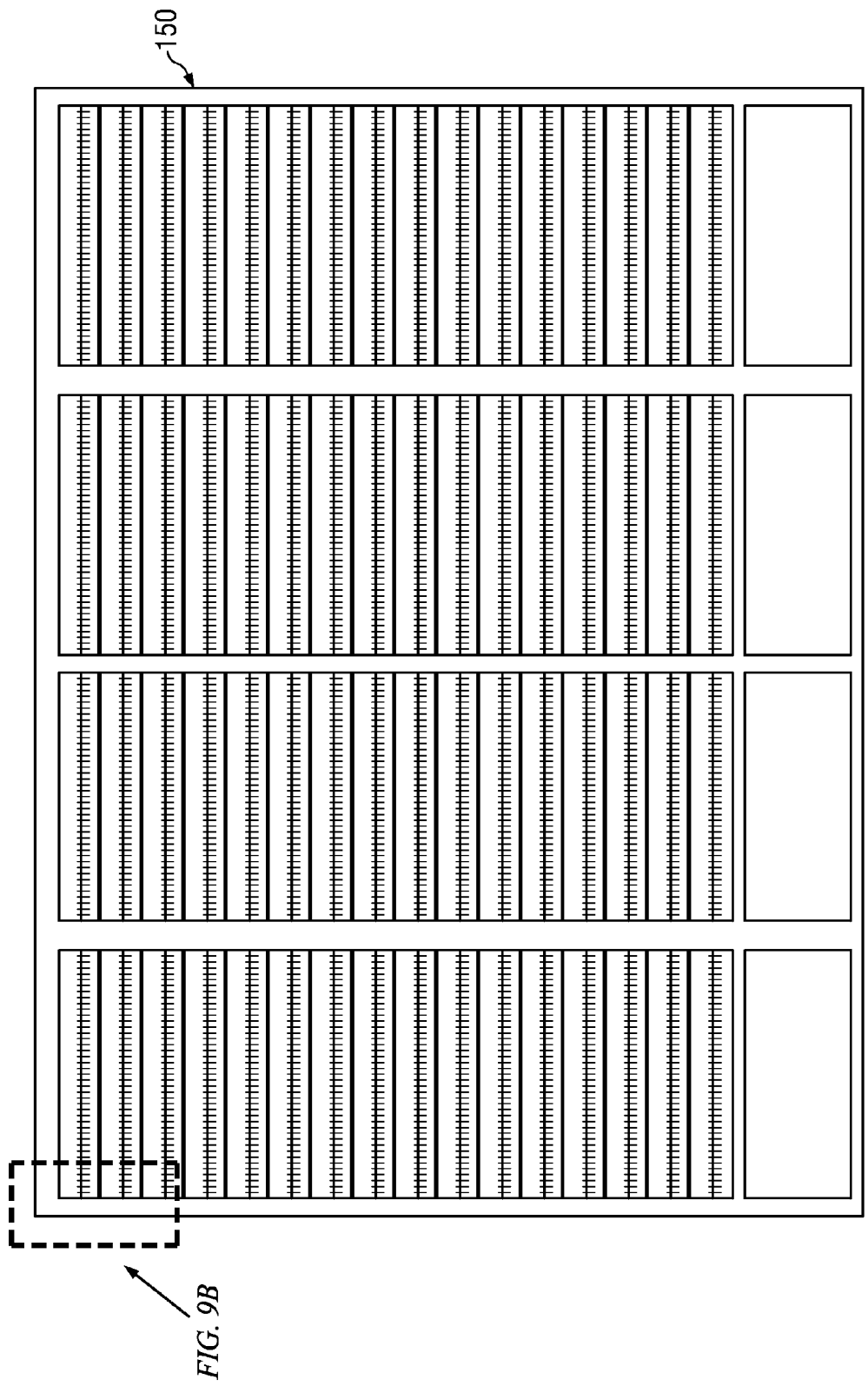
FIGS. 9A and 9B show the removal of small block regions of a first corrected IC layout.
Figure 9B:
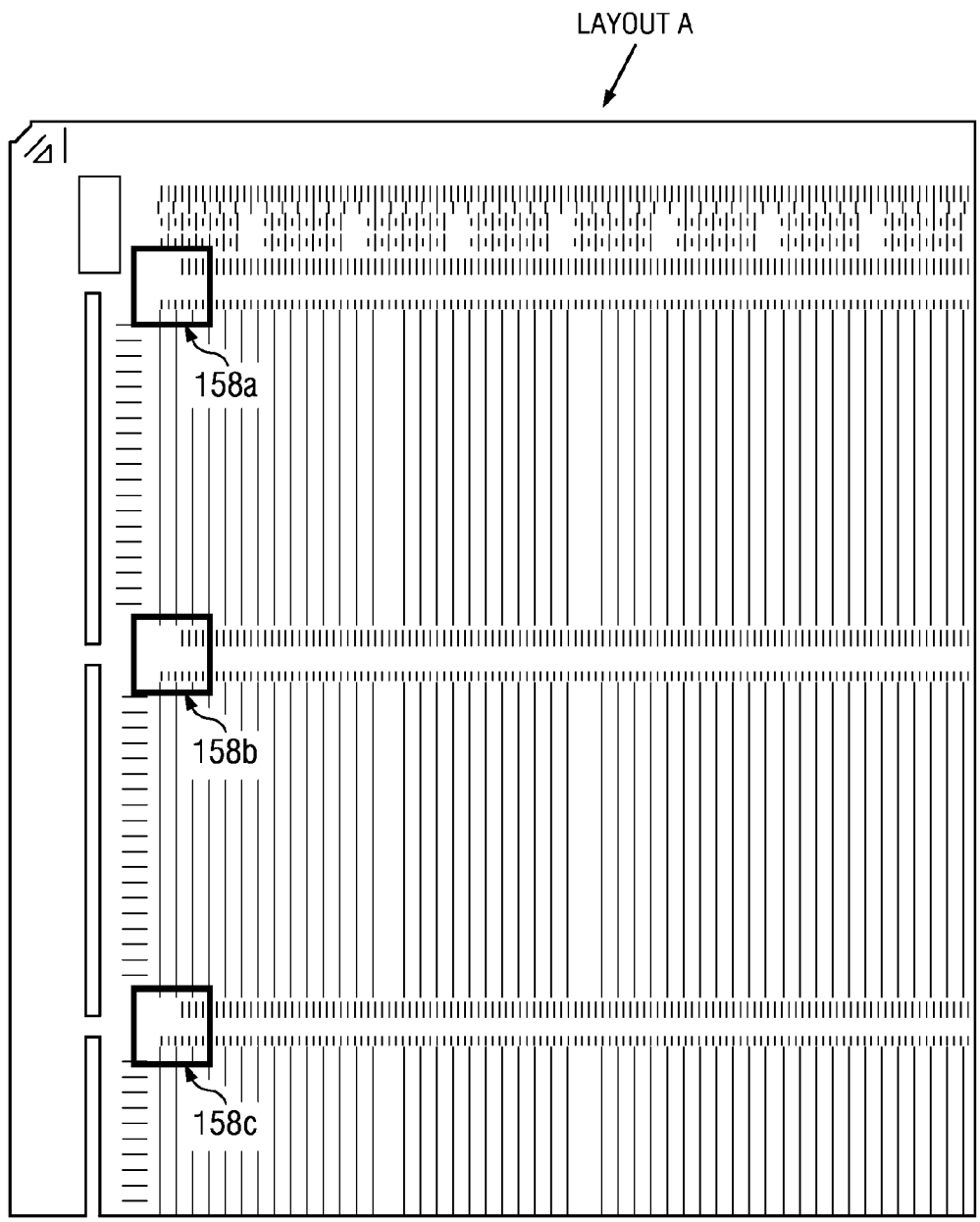

Turning next to FIGS. 9A and 9B, FIG. 9A shows an embodiment of a first corrected IC layout 150, while FIG. 9B shows an enlarged view of a portion of the first corrected IC layout 150 as indicated in FIG. 9A. As shown in FIG. 9B, small blocks 158a, 158b, and 158c are defined in the first corrected IC layout 150, and the portions of the first corrected IC layout within the small blocks 158a, 158b, and 158c are removed as indicated at block 108 in FIG. 4. The portion of the first corrected IC layout 150 that remains after removing the small blocks 158a-158c forms a "layout A" as indicated in block 108 of FIG. 4. The small blocks 158a, 158b, and 158c are defined based on the size and location of the small blocks in the second IC layout 140. A small block of identical size and location is defined within the first corrected IC layout 150 for each small block 128 of the second IC layout. So, in the present embodiment, the small block 158a is identical in size and location to the small block 128a, the small block 158b is identical in size and location to the small block 128b, and the small block 158c is identical in size and location to the small block 128c.

Figures 10A, 10B:
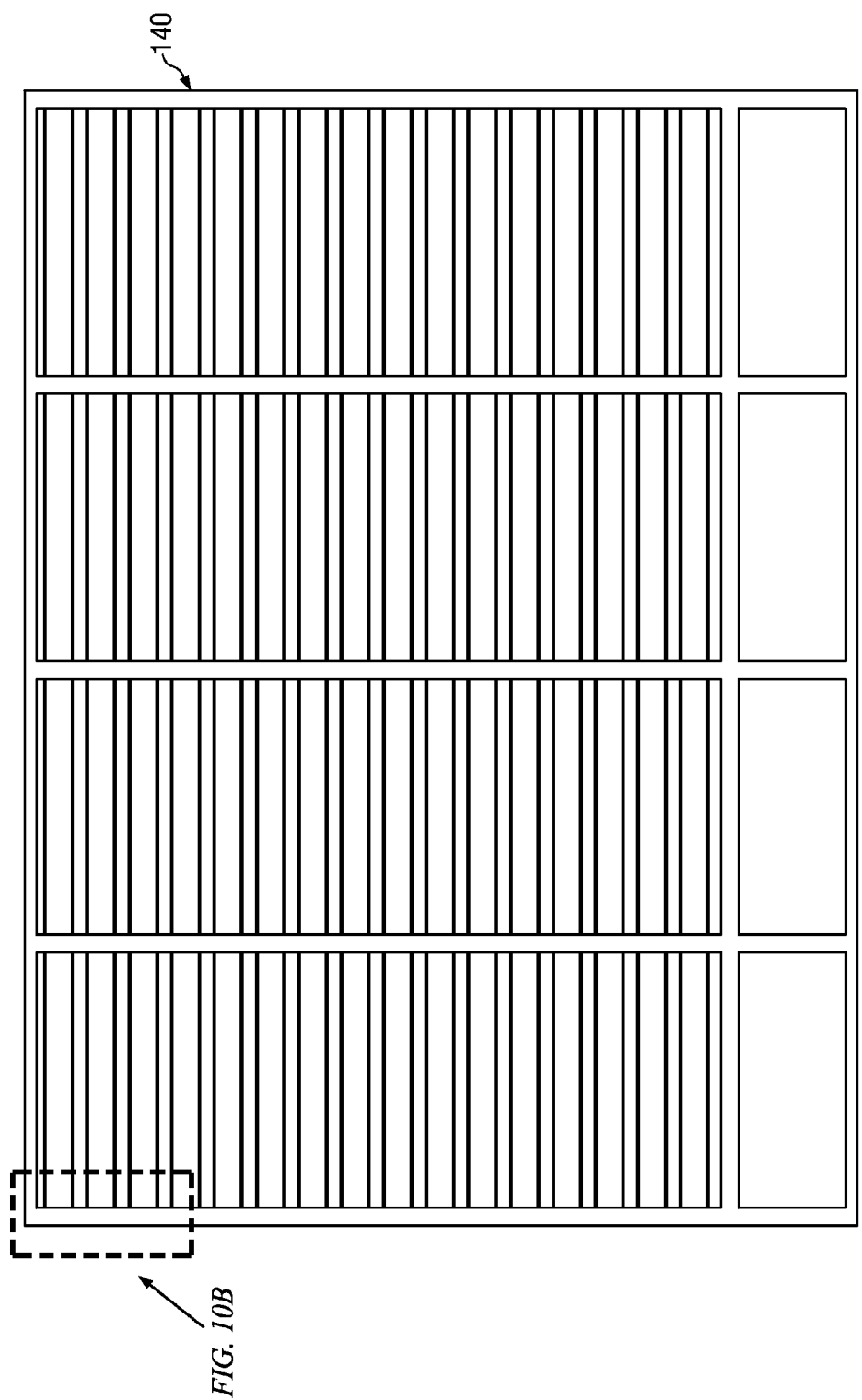
FIGS. 10A and 10B show the removal of all but the small block regions of a second partially-corrected IC layout.
Figure 10B:
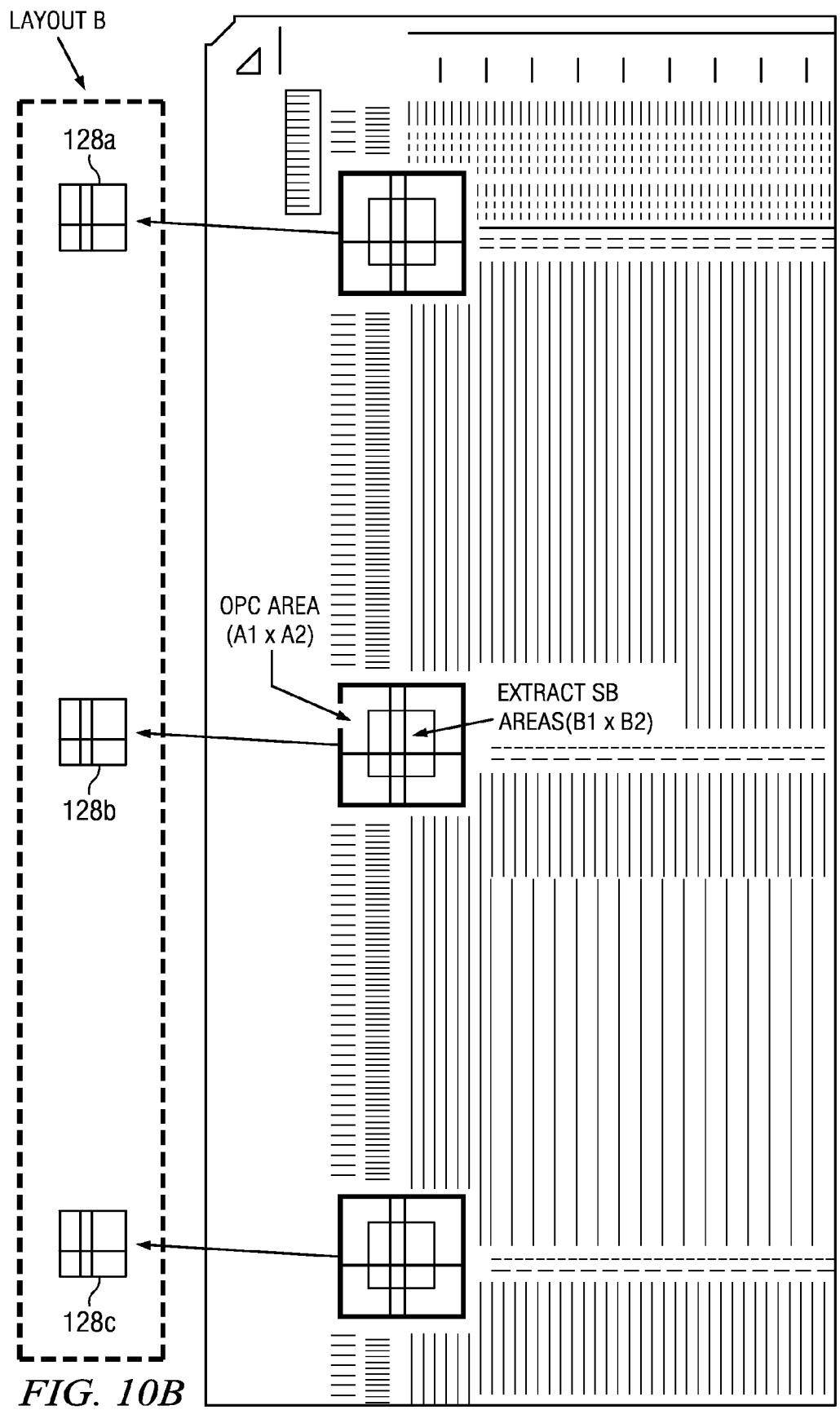

Next, as indicated at block 110 in FIG. 4, the entire layout is removed from the second partially-corrected IC layout except for portions of the layout that are within the small blocks 128a-128c. FIG. 10A shows the second partially-corrected IC layout 140, while FIG. 10B shows an enlarged view of a portion of the first corrected IC layout 140 as indicated in FIG. 10A. As shown in FIG. 10B, small blocks 128a, 128b, and 128c are extracted from the second partially-corrected IC layout 140 and the remainder of the second partially-corrected IC layout 140 can be discarded. The remaining portions of the second partially-corrected IC layout within the small blocks 128a-128c forms a "layout B" as indicated in block 110 of FIG. 4.

Figure 11A:
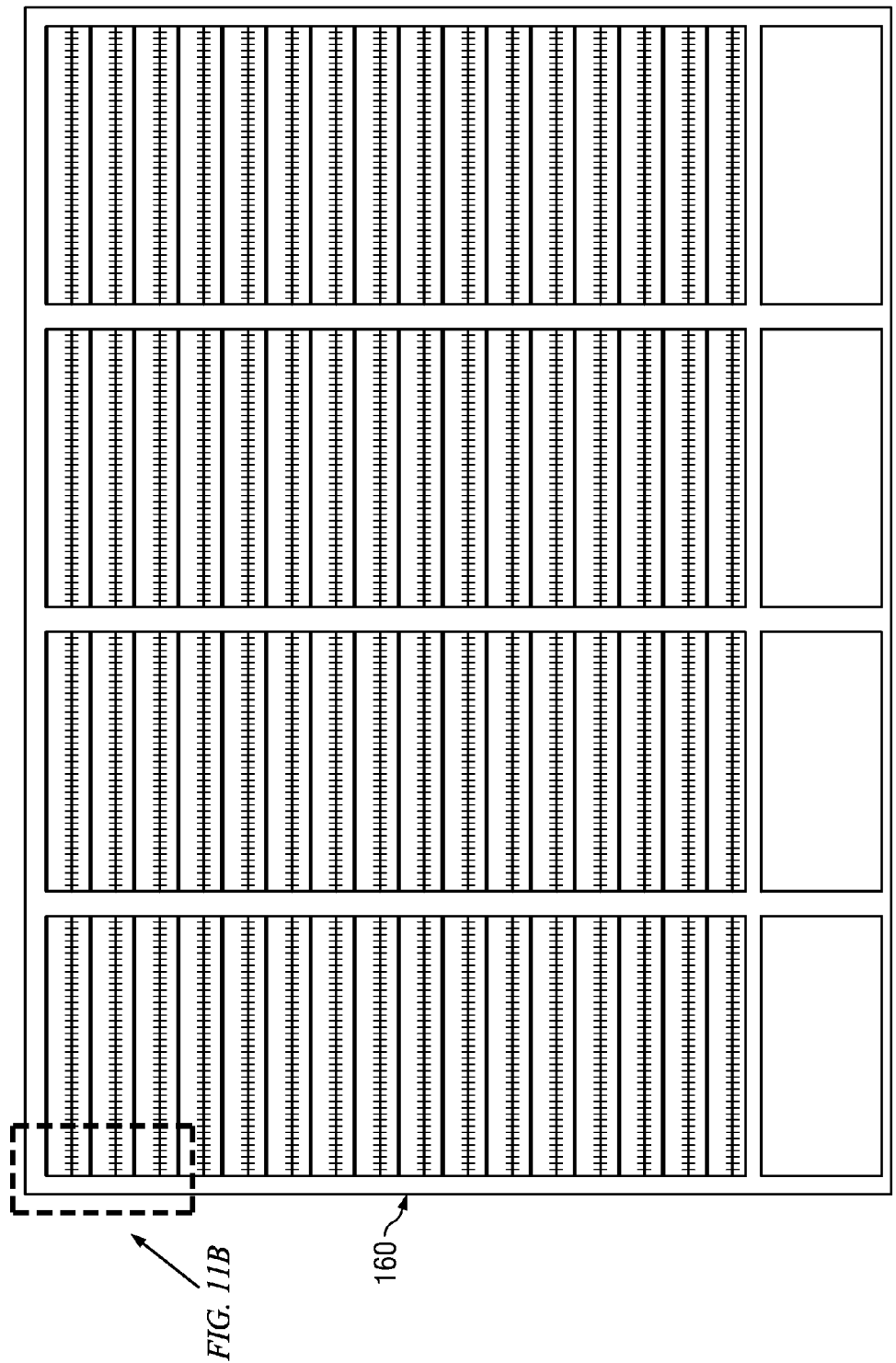
FIGS. 11A and 11B show the merging of small block regions from the second partially-corrected IC layout with remaining portions of the first corrected IC layout.
Figure 11B:
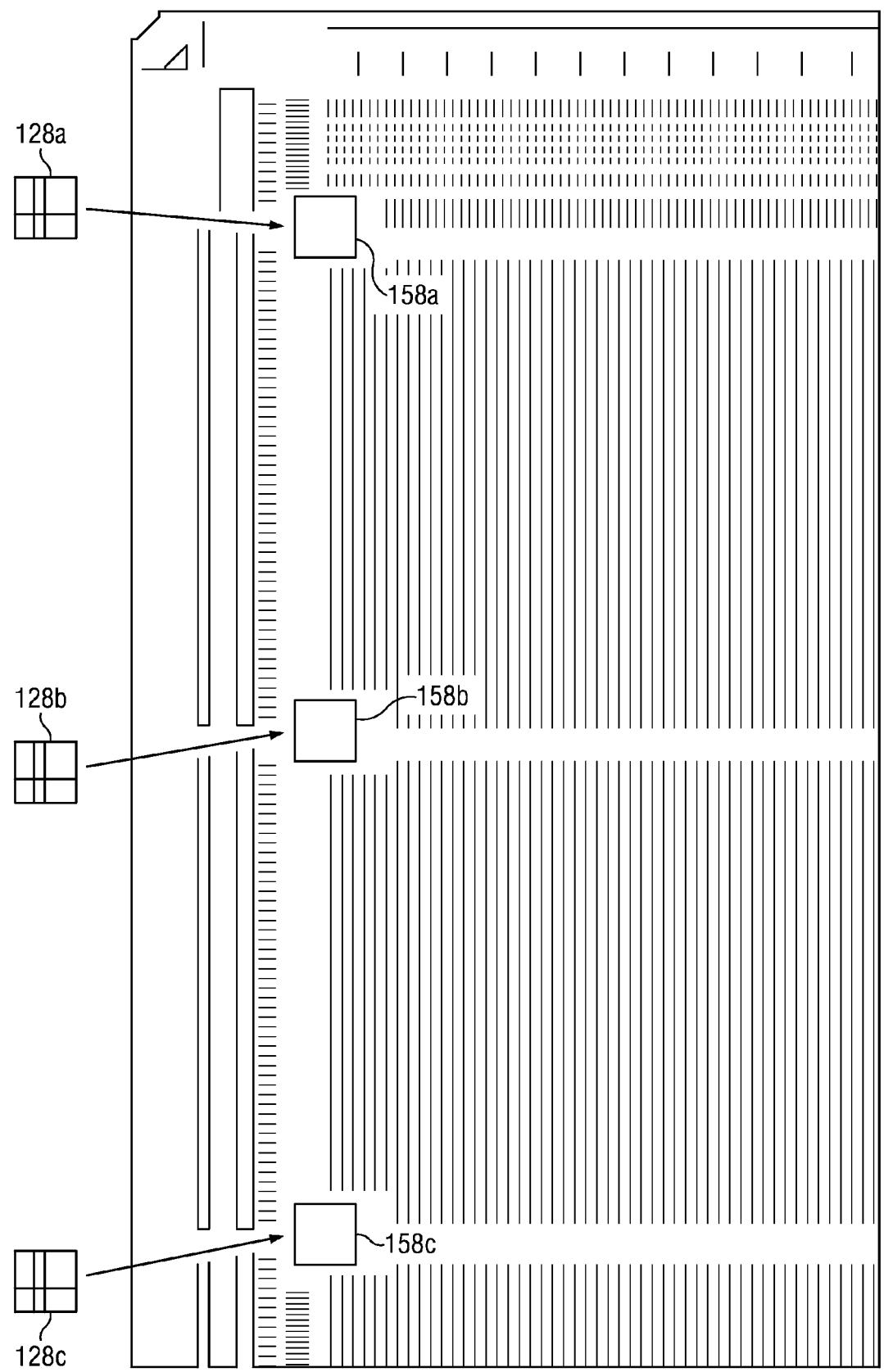

Next, as indicated at block 112 in FIG. 4, layout A and layout B are merged to form a second corrected IC layout, which is a final layout as referenced in block 112 in FIG. 4. Referring to FIGS. 11A and 11B, FIG. 11A shows the second corrected IC layout 160, which is the final layout. FIG. 11B shows an enlarged view of a portion of the first corrected IC layout 140 as indicated in FIG. 10A. As shown in FIG. 11B, the final layout 160 includes the small blocks 128a-128c, which were extracted from the second partially-corrected IC layout, in positions where the small blocks 158a-158c were removed from the first corrected IC layout.

Figure 12:
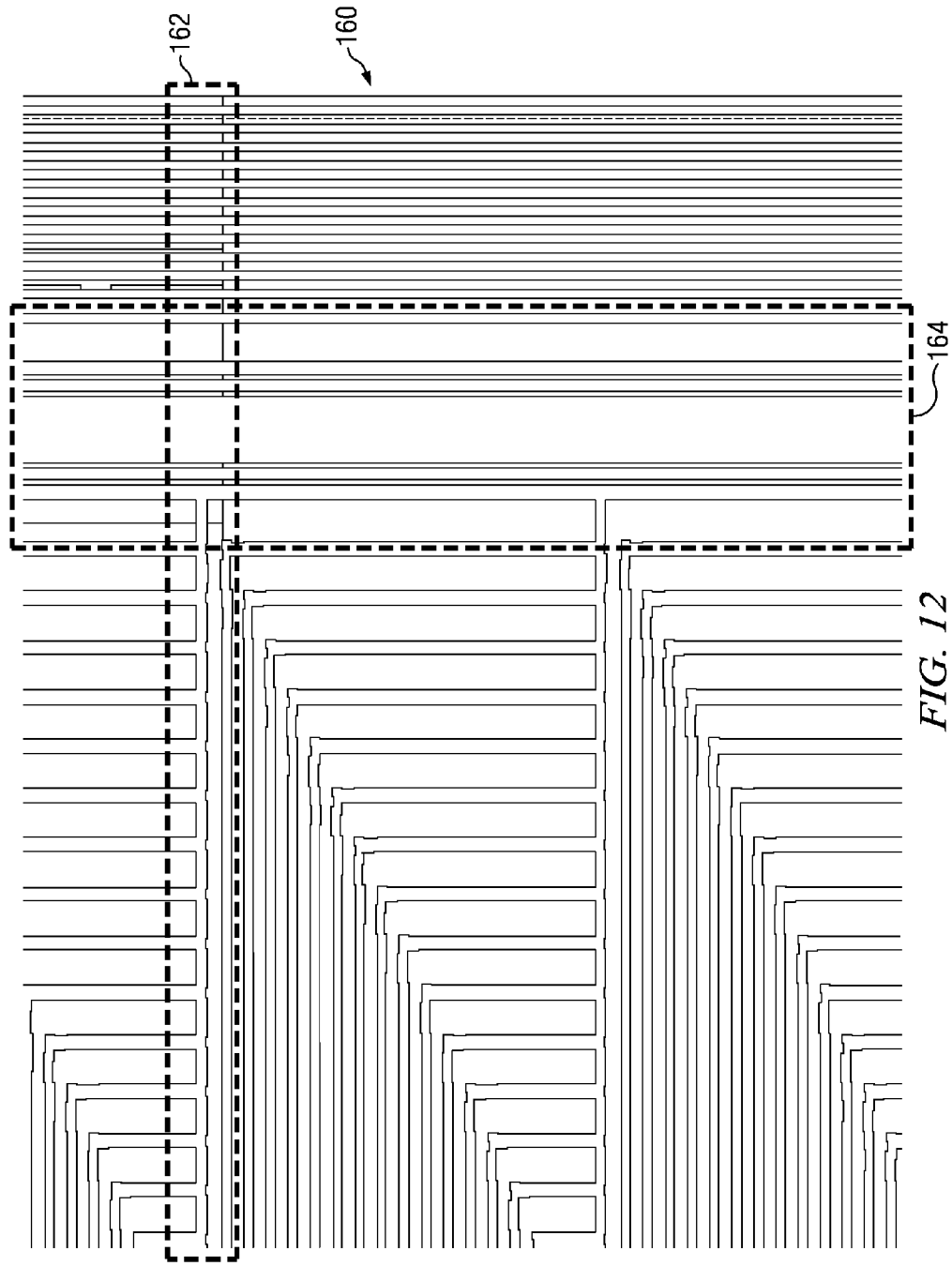
FIG. 12 shows an enlarged view of merged portions of the first corrected IC layout and the second partially-corrected IC layout.

FIG. 12 shows an enlarged view of a portion of the final layout 160, where regions 162 and 164 are merge-boundary regions. FIG. 12 illustrates the seamlessness of the boundaries that can be achieved with the process outlined in FIG. 4. The seamless boundaries can be achieved through the use of both a large block and a small block in the process shown in FIG. 4. The correction process, such as OPC, is performed on a large block, such as large block 126. On the other hand, only the small block 128 is merged with the first IC layout. However, it is desirable to perform the correction process on the larger block because it provides for improved consistency between structures near the boundary of the small block with corresponding structures of the first layout. This improved consistency allows for the boundaries of the small block to match the neighboring boundaries of the first IC layout where the small block is inserted.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method of modifying a first integrated circuit (IC) layout based on a second IC layout where the second IC layout includes a modification of the first layout, the method being performed by one or more processors, the method comprising:
   selecting a large block of the second IC layout using the one or more processors;
   performing, at the one or more processors, a correction operation on the large block, thereby generating a corrected large block;
   selecting a first small block using the one or more processors, wherein the first small block is a portion of the first layout;
   selecting a second small block using the one or more processors, wherein the second small block is a portion of the corrected large block;
   removing the first small block from the first IC layout using the one or more processors;
   removing all but the second small block from the second IC layout using the one or more processors; and
   merging the first and second IC layouts using the one or more processors.

2. The method of claim 1, wherein the large block of the second IC layout includes the modification of the first IC layout.

3. The method of claim 1, wherein the correction operation includes an optical proximity correction process.

4. The method of claim 1, wherein a location of the first small block within the first IC layout is the same as a location of the second small block within the second IC layout.

5. The method of claim 1, further comprising adding assist features to the second layout prior to performing the correction operation.

6. The method of claim 1, wherein the second small block is a central portion of the corrected large block.

7. The method of claim 1, wherein the first and second small blocks are the same size.

8. The method of claim 1, wherein the merging of the first and second IC layouts includes generating a merged IC layout.

9. The method of claim 8, further comprising outputting the merged IC layout as mask data.

10. The method of claim 1, wherein extents of the modification define a modified region having a length L1 and a width W1, and wherein the large block has a length L2 and a width W2, wherein L2 is substantially equal to twice a first distance that is 50 um longer than half of L1, and wherein W1 is substantially equal to twice a second distance that is 50 um longer than half of W1.

11. A system for modifying a first integrated circuit (IC) layout based on a second IC layout where the second IC layout includes a modification of the first layout, the system comprising one or more processors configured for:
   selecting a large block of the second IC layout;
   performing a correction operation on the large block, thereby generating a corrected large block;
   selecting a first small block, wherein the first small block is a portion of the first layout;
   selecting a second small block, wherein the second small block is a portion of the corrected large block;
   removing the first small block from the first IC layout;
   removing all but the second small block from the second IC layout; and
   merging the first and second IC layouts.

12. The system of claim 11, wherein the large block of the second IC layout includes the modification of the first IC layout.

13. The system of claim 11, wherein the correction operation includes an optical proximity correction process.

14. The system of claim 11, wherein a location of the first small block within the first IC layout is the same as a location of the second small block within the second IC layout.

15. The system of claim 11, wherein the one or more processors are further configured for adding assist features to the second layout prior to performing the correction operation.

16. The system of claim 11, wherein the second small block is a central portion of the corrected large block.

17. The system of claim 11, wherein the first and second small blocks are the same size.

18. The system of claim 11, wherein the merging of the first and second IC layouts includes generating a merged IC layout.

19. The system of claim 18, wherein the one or more processors are further configured for outputting the merged IC layout as mask data.

20. The system of claim 11, wherein extents of the modification define a modified region having a length L1 and a width W1, and wherein the large block has a length L2 and a width W2, wherein L2 is substantially equal to twice a first distance that is 50 um longer than half of L1, and wherein W1 is substantially equal to twice a second distance that is 50 um longer than half of W1.

21. A method of modifying a first integrated circuit (IC) layout based on a second IC layout, the method being performed by one or more processors, the method comprising:
   performing a correction operation, at the one or more processors, on a first large block of the second IC layout, thereby generating, at the one or more processors, a corrected first large block; and
   replacing a first small block of the first IC layout with a second small block of the second IC layout using the one or more processors,
   wherein the second small block includes a portion of the corrected first large block of the second IC layout.

22. The method of claim 21, wherein the performing of the correction operation further comprises performing a correction operation on a second large block of the second IC layout.

23. The method of claim 22, further comprising replacing a third small block of the first IC layout with a fourth small block of the second IC layout,
   wherein the fourth small block includes a portion of the second large block of the second IC layout.

24. The method of claim 21, wherein the first large block of the second IC layout includes a modification of the first IC layout.

25. The method of claim 21, wherein the correction operation includes an optical proximity correction process.

26. The method of claim 21, wherein a location of the first small block within the first IC layout is the same as a location of the second small block within the second IC layout.

27. The method of claim 21, further comprising adding assist features to the second layout prior to performing the correction operation.

28. The method of claim 21, wherein the second small block is a central portion of the first large block.

29. The method of claim 21, wherein the first and second small blocks are the same size.

30. The method of claim 21, wherein the replacing of the first small block of the first IC layout with the second small block of the second IC layout includes generating a merged IC layout.

31. The method of claim 30, further comprising outputting the merged IC layout as mask data.

\* \* \* \* \*